United States Patent
Lee et al.

(10) Patent No.: US 7,989,314 B2
(45) Date of Patent: Aug. 2, 2011

(54) METHOD OF MANUFACTURING A FLEXIBLE DEVICE AND METHOD OF MANUFACTURING A FLEXIBLE DISPLAY

(75) Inventors: Jong Lam Lee, Seoul (KR); Soo Young Kim, Gyeongsangbuk-Do (KR)

(73) Assignee: Postech Academy-Industry Foundation Pohang Univ. of Science & Technology, Hyoja-Dong, Nam-Gu, Pohang-Si, Gyeongsangbuk-Do (KR)

( * ) Notice: Subject to any disclaimer, the term of this patent is extended or adjusted under 35 U.S.C. 154(b) by 66 days.

(21) Appl. No.: 12/522,174

(22) PCT Filed: Jan. 8, 2008

(86) PCT No.: PCT/KR2008/000100
§ 371 (c)(1),
(2), (4) Date: Jul. 5, 2009

(87) PCT Pub. No.: WO2008/084956
PCT Pub. Date: Jul. 17, 2008

(65) Prior Publication Data
US 2010/0075447 A1    Mar. 25, 2010

(30) Foreign Application Priority Data

Jan. 8, 2007 (KR) .................. 10-2007-0002084
May 7, 2007 (KR) .................. 10-2007-0044171

(51) Int. Cl.
*H01L 21/762* (2006.01)
(52) U.S. Cl. .......................... 438/458; 257/E21.567
(58) Field of Classification Search .......... 257/E21.567; 438/478, 22, 26, 28, 458
See application file for complete search history.

(56) References Cited

U.S. PATENT DOCUMENTS

| | | | |
|---|---|---|---|
| 7,189,631 B2* | 3/2007 | Yamazaki et al. | 438/458 |
| 2003/0032210 A1 | 2/2003 | Takayama et al. | |
| 2003/0136966 A1 | 7/2003 | Inoue et al. | |
| 2003/0217805 A1 | 11/2003 | Takayama et al. | |
| 2004/0266165 A1 | 12/2004 | Utsunomiya | |
| 2005/0067952 A1 | 3/2005 | Fechter et al. | |
| 2006/0132461 A1 | 6/2006 | Furukawa et al. | |
| 2007/0087488 A1* | 4/2007 | Moriwaka | 438/149 |

FOREIGN PATENT DOCUMENTS
EP    1 426 813 A2    6/2004

OTHER PUBLICATIONS
The extended European Search Report mailed on Feb. 17, 2011.

* cited by examiner

*Primary Examiner* — Matthew Smith
*Assistant Examiner* — Daniel Shook

(57) ABSTRACT

Provided are a method of separating a metal layer and an organic light emitting diode. A method of manufacturing a flexible device and a method of manufacturing a flexible display include forming a releasing layer on a substrate, forming a metal layer on the releasing layer, forming an insulating layer on the metal layer, forming a releasable layer on the insulating layer, bonding a plastic to the releasable layer, and separating the substrate and the releasing layer at an interface therebetween to manufacture a flexible device. Since the conventional process equipment using the glass substrate can be compatibly used, the manufacturing cost can be reduced. In addition, since the glass substrate has less limitation in the process temperature compared with the plastic substrate, an electric device having a superior performance can be manufactured. Furthermore, the glass substrate has good thermal/chemical stability and is less deformed compared with the plastic substrate, whereby process control such as substrate alignment becomes easy.

16 Claims, 6 Drawing Sheets

[Figure 1]
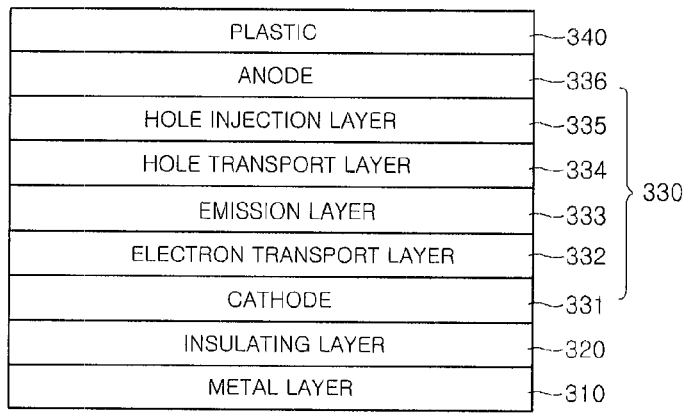
[Figure 2]
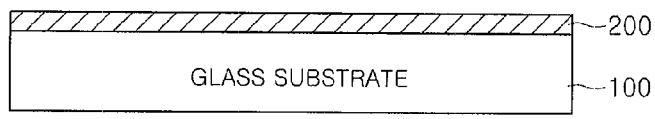
[Figure 3]
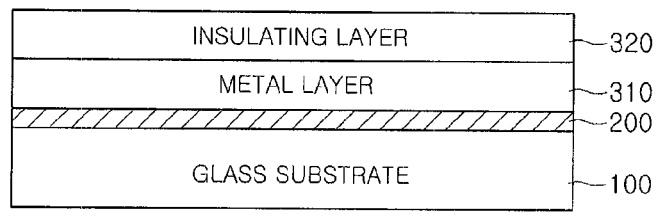
[Figure 4]
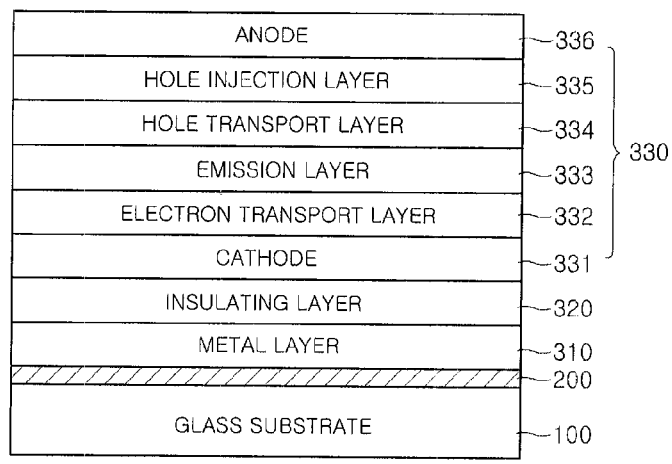

[Figure 5]
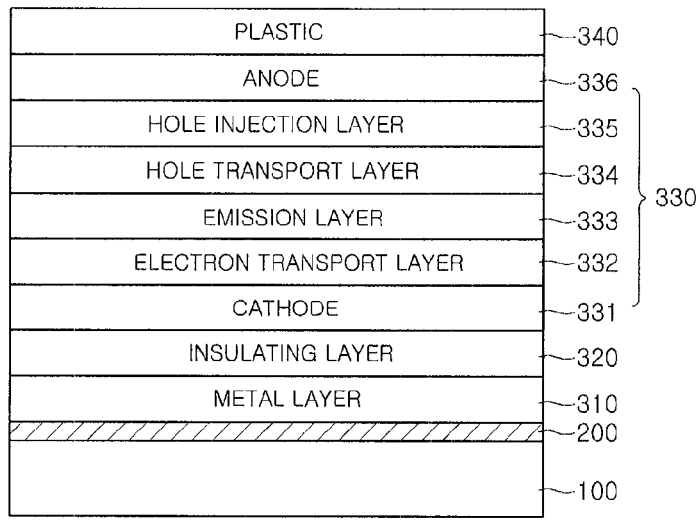
[Figure 6]
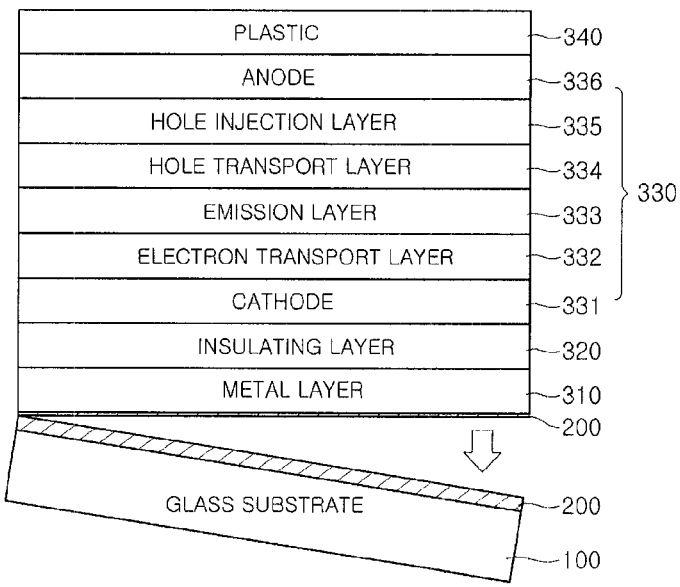
[Figure 7]
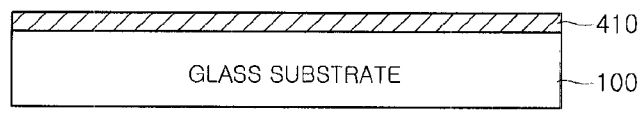
[Figure 8]
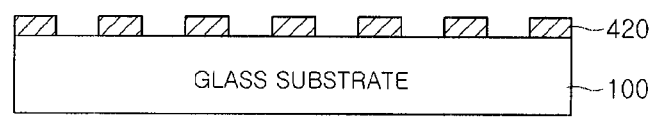

[Figure 9]
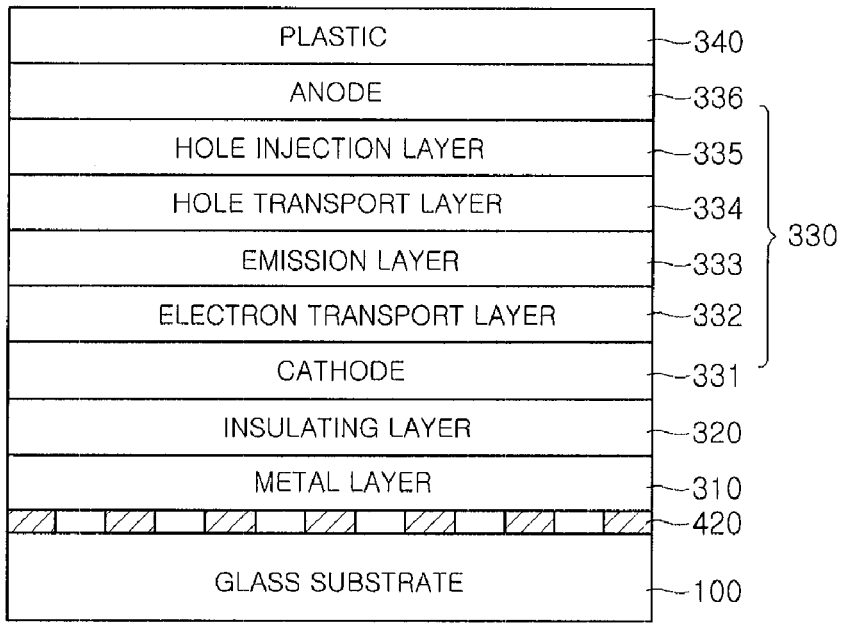
[Figure 10]
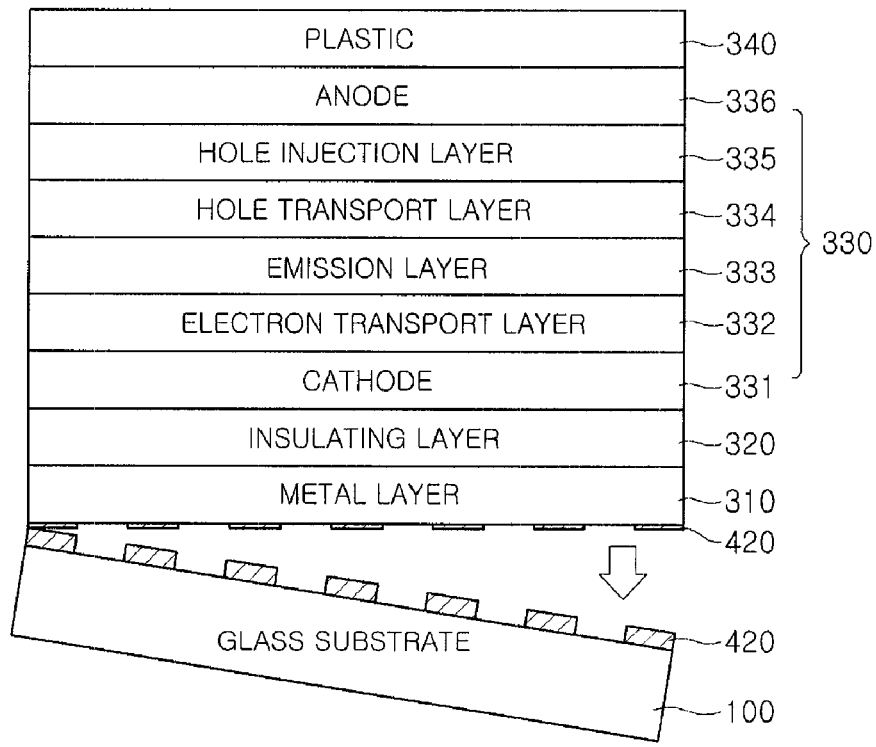

[Fig. 11]
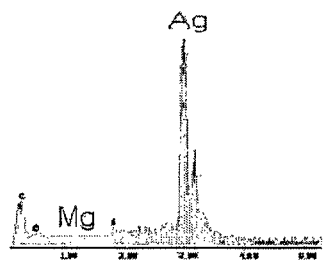
[Fig. 12]
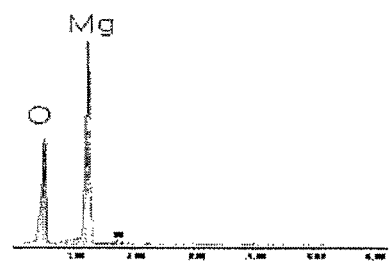
[Fig. 13]
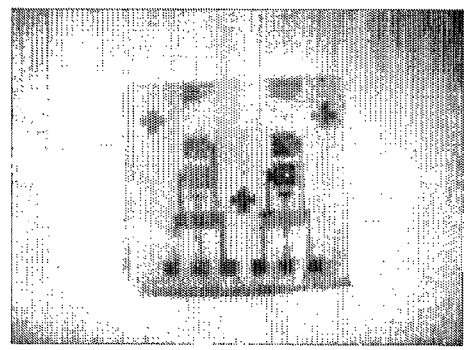
[Fig. 14]

[Fig. 15]
[Fig. 16]
[Fig. 17]
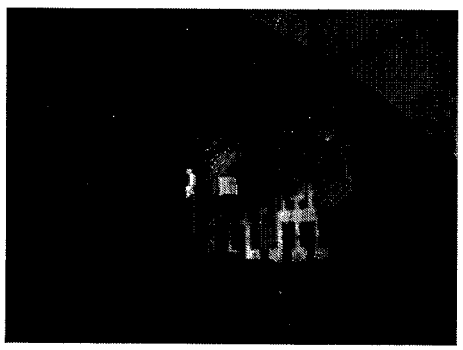
[Fig. 18]
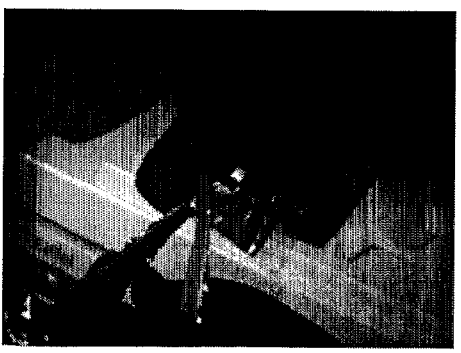

[Figure 19]
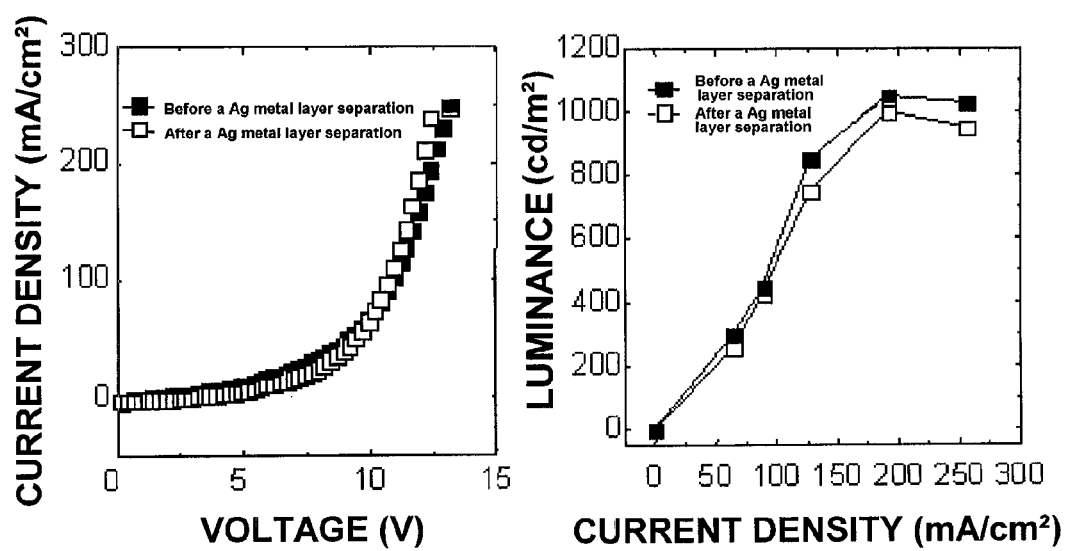

METHOD OF MANUFACTURING A FLEXIBLE DEVICE AND METHOD OF MANUFACTURING A FLEXIBLE DISPLAY

CROSS-REFERENCE TO RELATED APPLICATION

This application is a U.S. national phase application of PCT International Application PCT/KR2008/000100, filed Jan. 8, 2008, which claims priority to Korean Patent Application Nos. 10-2007-0002084, filed Jan. 8, 2007 and 10-2007-0044171, filed May 7, 2009, the contents of which are incorporated herein by reference in their entirety.

TECHNICAL FIELD

The present disclosure relates to a method of manufacturing a flexible device and a method of manufacturing a flexible display, and more particularly, to a method of manufacturing a flexible device and a method of manufacturing a flexible display capable of utilizing a stable glass substrate process technology.

BACKGROUND ART

An ordinary organic light emitting device has a stacked structure for maximizing light emitting efficiency through recombination of holes and electrons. Glass is used for a substrate, indium tin oxide (ITO) that is transparent and has a high work function and conductivity is used for an anode, and a metal having a low work function such as Mg/Ag or Al is used for a cathode. Holes injected from an anode and electrons injected from a cathode are recombined in an organic material layer that is an emission layer to generate excitons. As the excitons diffuse, light corresponding to a band gap of the emission layer is emitted toward a transparent electrode. A display device using the organic light emitting device can realize a good display image without drawbacks associated with image sticking and viewing angle. Further, the display device using the organic light emitting device has low power consumption because it is a self-light emitting device that does not require backlight. In addition, the organic light emitting device may be more affordable by more customers due to the low cost because it can be manufactured at a low temperature through simple processes. In particular, a flexible organic light emitting device has been focused recently because degree of freedom of a product can be remarkably improved.

To manufacture a flexible organic light emitting device, a method of manufacturing an organic light emitting device on a mother substrate such as a thin glass substrate, a metal substrate and a plastic substrate have been studied, however, there are several limitations to be overcome. The thin glass substrate has a limitation in the flexibility. On the other hand, a rough surface of the metal substrate causes a decrease of device characteristic, and a good conductivity thereof generates electrical interference between devices. When a plastic substrate is used, there is a difficulty in chemical treatment. Further, there is also a difficulty in pattern formation and substrate alignment because the plastic substrate is too flexible. Therefore, mass production is difficult. In particular, since the plastic substrate has a low thermal stability, the process should be performed at a low temperature. Therefore, it is difficult to decrease a resistance of indium tin oxide (ITO) used for a cathode of the organic light emitting device to a value below 70 ohm/cm2, by which an operation voltage of the organic light emitting device is increased. Additionally, a sealing process and a manufacturing process of an electric field device cannot be performed at a high temperature, which leads to a decrease in device characteristics.

As described above, there are limitations in manufacturing a flexible device, and even though the flexible device is manufactured, the device characteristic becomes poor compared to typical other devices.

DISCLOSURE

Technical Problem

The present disclosure provides a method of manufacturing a flexible device and a method of manufacturing a flexible display capable of utilizing a conventional stable glass substrate process technology by forming a releasing layer, a metal layer, an insulating layer, and a semiconductor device layer on a glass substrate, bonding a flexible substrate onto the semiconductor device layer, and thereafter removing the rigid glass substrate.

Technical Solution

In accordance with an exemplary embodiment, a method of manufacturing a flexible device includes: forming a releasing layer on a mother substrate; forming a metal layer on the releasing layer; forming an insulating layer on the metal layer; forming a semiconductor device layer on the insulating layer; bonding a flexible substrate to the semiconductor device layer; and separating the mother substrate and the releasing layer at an interface therebetween to remove the mother substrate.

The releasing layer may be formed of one of MgO, MnO, Mn3O4, MoOy, SnO2, SeOx, SiOx, GaOx, InO, TixOy, VxOy, ZrOy, WOy, Al2O3, SrO, TexOy, TeO2, ZnO, ITO, IZO, SiN, TiN, TaN, AlN, BN, MO2N, VN, ZrN, NbN, CrN, Ga and combinations thereof. The releasing layer may be formed to have a thickness of 1 nm or more.

The metal layer may be formed of one of Ag, Au, Cu, Cr, W, Al, W, Mo, Zn, Ni, Pt, Pd, Co, In, Mn, Si, Ta, Ti, Sn, Zn, Pb, V, Ru, Ir, Zr, Rh and combinations thereof. The metal layer may be formed to have a thickness of 1 nm or more.

The insulating layer may be formed of an insulator including one of silicon oxide (SiO2), silicon nitride (SiNx), photoresist, polyimide and combinations thereof.

The semiconductor device layer may include at least one of an organic light emitting diode and an organic field transistor.

A glass substrate may be used as the mother substrate, and a plastic substrate may be used as the flexible substrate.

In accordance with another exemplary embodiment, a method of manufacturing a flexible display, the method includes: forming a releasing layer on a mother substrate; forming a metal layer on the releasing layer; forming an insulating layer on the metal layer; forming a semiconductor device layer comprising a light emitting device on the insulating layer; bonding a flexible substrate to the semiconductor device layer; and separating the mother substrate and the releasing layer at an interface therebetween to remove the mother substrate.

The releasing layer may be formed of one of MgO, MnO, Mn3O4, MoOy, SnO2, SeOx, SiOx, GaOx, InO, TixOy, VxOy, ZrOy, Cy, Al2O3, SrO, TexOy, TeO2, ZnO, ITO, IZO, SiN, TiN, TaN, AlN, BN, MO2N, VN, ZrN, NbN, CrN, Ga and combinations thereof.

The metal layer may be formed of one of Ag, Au, Cu, Cr, W, Al, W, Mo, Zn, Ni, Pt, Pd, Co, In, Mn, Si, Ta, Ti, Sn, Zn, Pb, V, Ru, Ir, Zr, Rh and combinations thereof.

The insulating layer may be formed of an insulator including one of silicon oxide (SiO2), silicon nitride (SiNx), photoresist, polyimide and combinations thereof.

The semiconductor device layer may include at least one of an organic light emitting diode and an organic field transistor.

A glass substrate may be used as the mother substrate, and a plastic substrate may be used as the flexible substrate.

Advantageous Effects

As described above, a flexible device is manufactured by forming a releasing layer on a substrate; stacking a metal layer, an insulating layer, and a released layer on the releasing layer; bonding a plastic substrate to the stacked structure; and separating the substrate and the releasing layer using an external force. Therefore, the following effects can be obtained.

The manufacturing cost can be reduced because a conventional equipment for a glass substrate can be used compatibly.

In addition, a device having a superior performance can be manufactured compared with a flexible device manufactured on a plastic substrate, since there is no limitation in a process temperature for manufacturing a device.

Furthermore, use of the glass substrate reduces deformation caused by heat and chemicals in manufacturing a device, and it is easy to align the substrate.

DESCRIPTION OF DRAWINGS

Exemplary embodiments can be understood in more detail from the following description taken in conjunction with the accompanying drawings, in which:

FIG. 1 is a cross-sectional view of a flexible electrical device in accordance with an exemplary embodiment;

FIGS. 2 to 6 are cross-sectional views illustrating a process of manufacturing a flexible electrical device in accordance with the exemplary embodiment;

FIGS. 7 to 10 are cross-sectional views illustrating a process of manufacturing a flexible electrical device in accordance with another exemplary embodiment;

FIGS. 11 and 12 are graphs showing measured results of an energy-dispersive X-ray spectrometer after a metal layer separation in accordance with an experimental example;

FIGS. 13 through 16 are photographs sequentially showing a process of separating a metal layer in accordance with an experimental example; and FIGS. 17 to 19 are photographs and graphs showing the characteristic of an organic light emitting device before and after a metal layer separation in accordance with an experimental example.

BEST MODE

Preferred embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

In the figures, the dimensions of layers and regions are exaggerated for clarity of illustration. Like reference numerals refer to like elements throughout. It will also be understood that when a layer, a film, a region, or a substrate is referred to as being on another layer, film, region, or substrate, it can be directly on the other layer, film, region, or substrate, or intervening layers, films, regions, or substrates, may also be present.

Embodiment 1

FIG. 1 is a cross-sectional view of a flexible electrical device in accordance with an exemplary embodiment.

Referring to FIG. 1, the flexible electrical device includes an insulating layer 320 and a semiconductor device layer 330 disposed on a metal layer 310 serving as an auxiliary substrate. The flexible electrical device further includes a flexible substrate 340 attached on a surface of the semiconductor device layer 330.

At least one semiconductor device including a semiconductor thin film is formed on the semiconductor device layer 330. For example, an organic light emitting diode (OLED), an organic field effect transistor or the like may be formed. In this exemplary embodiment, OLEDs are arranged in a matrix form in the semiconductor device layer 330 to serve as a unit pixel that uniquely emits at least one of three primary colors. Here, the OLED may be provided in plurality so as to correspond to a plurality of unit pixels, however, FIG. 1 illustrates only one OLED for convenience.

The OLED 330 includes a cathode 331, an electron transport layer 332, an emission layer 333, a hole transport layer 334, and an anode 336 that are sequentially provided from the bottom to the top. The OLED 330 may further include a hole injection layer 335 disposed between the hole transport layer 334 and the anode 336. When an external current is applied through the two electrodes of the OLED 330, electrons injected from the electron transport layer 332 and holes injected from the hole transport layer 334 are recombined in the emission layer 333 to generate excitons. As the excitons diffuse, light corresponding to an energy band gap of the emission layer 333 is emitted. Here, the emission layer 333 may be formed as a multi-layered semiconductor thin film having a single or multiple quantum well structure by alternately stacking a well layer containing an organic light emitting material and a barrier layer. Since a wavelength of an output light is varied depending on the contained organic light emitting material, a proper organic light emitting material may be selected depending on a required output wavelength.

The OLED 330 of the this exemplary embodiment outputs one light of the three primary colors to reproduce natural colors. Meanwhile, alternatively, three primary color filters may be disposed on an entire surface of an OLED outputting a white color to reproduce natural colors. In addition, the OLED 330 of this exemplary embodiment is configured as a top emission type where light is emitted upwardly. Therefore, an upper portion of the emission layer 333 including the anode 336 and the flexible substrate 340 may be formed of a light-transmissive material, and at least one layer of a lower portion of the emission layer 333 including the cathode 331 and the metal layer 310 may serve as a reflective layer. Alternatively, the OLED 330 of this exemplary embodiment may be configured as a bottom emission type where light is emitted in a downward direction. In the bottom emission type, a lower portion of the emission layer 333 including the cathode 331 and the metal layer 310 may be formed of a light-transmissive material, and at least one layer of an upper portion of the emission layer 333 including the anode 336 and the flexible substrate 340 may serve as a reflective layer.

The flexible electrical device is obtained by forming a multi-layered thin film including a releasing layer (not shown), the metal layer 310, the insulating layer 320, and the semiconductor device layer 330, then attaching the flexible substrate 340 on the multi-layered thin film, and separating the releasing layer and the metal layer 310 at an interface therebetween to remove a mother substrate. The flexible substrate 340 may be formed after removing the mother substrate.

A manufacturing process of the flexible electrical device having the above structure will be described with reference to FIGS. 2 to 6. FIGS. 2 to 6 are cross-sectional views illustrating a process of manufacturing a flexible electrical device in accordance with the exemplary embodiment.

Referring to FIG. 2, a releasing layer 200 is formed on a mother substrate 100. A glass substrate which can be processed by a stable semiconductor process technology may be used as the mother substrate 100. The releasing layer 200 may be formed of a material having low surface energy, e.g., one of MgO, MnO, Mn3O4, MoOy, SnO2, SeOx, SiOx, GaOx, InO, TixOy, VxOy, ZrOy, WOy, Al2O3, SrO, TexOy, TeO2, ZnO, ITO, IZO, SiN, TiN, TaN, AlN, BN, MO2N, VN, ZrN, NbN, CrN, Ga and combinations thereof. The releasing layer 200 may be formed to have a thickness of approximately 1 nm or more. If the releasing layer 200 is too thin, a bonding force between the mother substrate 100 and a metal layer which is formed on the mother substrate 100 may become strong to make it difficult to separate the mother substrate 100.

Referring to FIG. 3, a metal layer 310 and an insulating layer 320 are sequentially stacked on the entire surface of the resultant structure including the releasing layer 200. The metal layer 310 may be formed of one of Ag, Au, Cu, Cr, W, Al, Mo, Zn, Ni, Pt, Pd, Co, In, Mn, Si, Ta, Ti, Sn, Zn, Pb, V, Ru, Ir, Zr, Rh and combinations thereof using various metal deposition methods, e.g., electron beam deposition, hot filament deposition, sputter deposition, or electroplating. The metal layer 310 is used as an auxiliary substrate for supporting the thin film structure existing thereon when the mother substrate 100 is separated and removed, and thus may be formed to have a thickness of approximately 1 nm or more. The metal layer 310 is too thin, it may be torn out when the mother substrate 100 is separated and removed using an external force. The insulating layer 320 may be formed by depositing an insulator, e.g., silicon oxide (SiO2), silicon nitride (SiNx), or the like having good insulating and adhesive properties through metal organic chemical vapor deposition (MOCVD), or the like. The insulating layer 320 may be formed by applying an insulator such as photoresist or polyimide through spin coating in order to reduce the process time. The insulating layer 320 electrically separates electrical devices of a semiconductor device layer which is formed thereon to prevent mutual interference.

Referring to FIG. 4, a semiconductor device layer 330 is formed on an entire surface of the resultant structure including the insulating layer 320. For example, the semiconductor device layer 330 may include a green OLED outputting a wavelength range of approximately 520 nm. The green OLED is formed by sequentially stacking an Al cathode 331, an Alq3 electron transport layer 332, an emission layer 333, an α-NPD hole transport layer 334, a CuPc hole injection layer 335, and an Au anode 336 from the bottom to the top. Of course, since a wavelength of an output light is varied depending on an organic light emitting material contained in the emission layer 333, a proper organic light emitting material may be selected depending on a required output wavelength.

Referring to FIG. 5, a flexible substrate 340 is bonded to an entire surface of the resultant structure including the semiconductor device layer 330. Here, the flexible substrate 340 may be formed of plastic which has good physical/chemical stability and good flexibility and is inexpensive.

Referring to FIG. 6, after the upper structure including the releasing layer 200, the metal layer 310, the insulating layer 320, the semiconductor device layer 330, and the flexible substrate 340 is formed on the mother substrate 100, the mother substrate 100 is then separated from the upper structure at the interface between the releasing layer 200 and the metal layer 310. That is, an external force, i.e., a shear stress, is applied to the mother substrate 100 and the upper structure in opposite directions, and thereby the releasing layer 200 and the metal layer 310 are separated at the interface therebetween. Here, if the separation is not easy, a laser lift-off process of radiating excimer laser to the releasing layer 200 from the bottom of the mother substrate 100 may be additionally performed. After the separated mother substrate 100 is removed, only the upper structure including the metal layer 310, the insulating layer 320, the semiconductor device layer 330, and the flexible substrate 340 is remained. Therefore, various flexible electrical devices may be manufactured using the above process.

Embodiment 2

A flexible electrical device in accordance with another exemplary embodiment can be manufactured by forming a releasing layer on a glass substrate that is a mother substrate, and patterning the releasing layer to form a releasing layer pattern in which predetermined regions are removed, stacking a metal layer, an insulating layer, and a semiconductor device layer on the releasing layer pattern, bonding plastic on the semiconductor device layer, and thereafter separating an interface between the mother substrate and the releasing layer pattern.

By forming the releasing layer pattern, a contact area between the releasing layer and the metal layer increases to maximize an adhesive force. Therefore, the semiconductor device layer can be easily formed even though an adhesive force between the releasing layer and the metal layer is small. Hereinafter, a method of manufacturing the flexible electrical device in accordance with the present exemplary embodiment will be described in more detail.

FIGS. 7 to 10 are cross-sectional views illustrating a process of manufacturing a flexible electrical device in accordance with the present exemplary embodiment.

Referring to FIGS. 7 and 8, a releasing layer 410 is formed on a mother substrate 100, and a patterning process using a mask is performed to form a releasing layer pattern 420. In the patterning process, photoresist is applied on the releasing layer 410 to have a uniform thickness, a photolithography process using a mask is performed to form a photoresist pattern, and an etching process is performed on the releasing layer 410 using the photoresist pattern as an etch mask. As such, some region of the releasing layer 410 that is not shielded by the etch mask is removed to form the releasing layer pattern 420 in a predetermined form. By forming the releasing layer pattern, a contact area between the releasing layer 410 and a metal layer increases to maximize an adhesive force therebetween. Therefore, a semiconductor device layer can be easily formed even though an adhesive force between the releasing layer 410 and the metal layer is small.

Referring to FIG. 9, a multi-layered thin film including a metal layer 310, an insulating layer 320, a semiconductor device layer 330 is formed on an entire surface of the resultant structure including the releasing layer pattern 420, and a flexible substrate 340 is bonded to a surface of the multi-layered thin film. The flexible substrate may include a plastic substrate that has good flexibility and is inexpensive.

Referring to FIG. 10, after an upper structure including the releasing layer pattern 420, the metal layer 310, the insulating layer 320, the semiconductor device layer 330, and the flexible substrate 340 is formed on the mother substrate 100, the releasing layer pattern 420 and the metal layer 310 are separated from each other at the interface, whereby the mother substrate 100 is separated from the upper structure. As described above, by forming the releasing layer pattern 420, a contact area between the releasing layer and the metal layer 310 increases to maximize an adhesive force therebetween, and even though an adhesive force between the releasing layer and the metal layer 310 is small, the semiconductor device layer 330 can be easily formed.

The flexible electrical device in accordance with the above described embodiments can be easily bent within a predetermined range due to the flexibility of the flexible substrate, and thus can be applied to various products. For example, a plurality of OLEDs may be formed in a matrix form so that each OLED can serve as a unit pixel uniquely emitting at least one of the three primary colors, to manufacture a display device capable of reproducing an image.

In addition, the flexible electrical device in accordance with the above described embodiments has various advantages because a glass substrate is used as a mother substrate. Since a conventional process equipment using the glass substrate can be used compatibly, the manufacturing cost can be reduced. In addition, since the glass substrate has less limitation in the process temperature compared with the plastic substrate, an electric device having a superior performance can be manufactured. Further, the glass substrate has good thermal/chemical stability and is less deformed compared with the plastic substrate, whereby process control such as substrate alignment becomes easier.

FIGS. 11 and 12 are graphs showing measured results of an energy-dispersive X-ray spectrometer after a metal layer separation in accordance with an experimental example. Specifically, FIGS. 11 and 12 shows measured results of a surface of an Ag metal layer and a surface of the glass substrate, respectively, after separating the metal layer with an external force when an MgO releasing layer and an Ag metal layer are used. Referring to FIG. 11, after separation of the metal layer, a small amount of MgOx remains under the Ag metal layer. Referring to FIG. 12, after separation of the metal layer, a large amount of MgOx remains on the glass substrate. This result indicates that separation occurs at the interface between the MgOx releasing layer and the Ag metal layer when the metal layer is separated by an external force.

FIGS. 13 to 16 are photographs sequentially showing a process of a metal layer separation in accordance with an experimental example.

Referring to FIGS. 13 to 16, separation occurs at the interface between the metal layer and the releasing layer when an external force is applied, because the Ag metal layer is formed on the MgO releasing layer, not directly on the glass substrate. Therefore, the glass substrate can be easily separated from the metal layer with a relatively small force (strength of a force: 1 gf/cm2 or more).

FIGS. 17 to 19 are photographs and graphs showing the characteristic of an organic light emitting device before and after a metal layer separation in accordance with an experimental example. FIG. 17 is a photograph showing an operation of the device before the metal layer separation, FIG. 18 is a photograph showing an operation of the device after the metal layer separation, and FIG. 19 shows a current density versus voltage graph and a luminance versus current density graph before and after the metal layer separation.

Referring FIG. 17, the device operates normally before the metal layer separation. Referring to FIG. 18, the device operates normally even after the metal layer separation. Referring to the current density versus voltage graph of FIG. 19, the electrical characteristic does not change before and after the metal layer separation. Referring to the luminance versus current density graph of FIG. 19, there is no change in the optical characteristic of the device. These results indicate that a method of separating the metal layer in accordance with the embodiments is very effective in realizing the flexible electrical device.

Although the method of manufacturing the flexible device and the method of manufacturing the flexible display have been described with reference to the specific embodiments and drawings, they are not limited thereto. Therefore, it will be readily understood by those skilled in the art that various modifications and changes can be made thereto without departing from the spirit and scope of the present invention is defined by the appended claims.

The invention claimed is:

1. A method of manufacturing a flexible device, the method comprising:
   forming a releasing layer on a mother substrate;
   forming a releasing layer pattern by patterning the releasing layer;
   forming a metal layer on the releasing layer pattern;
   forming an insulating layer on the metal layer;
   forming a semiconductor device layer on the insulating layer;
   bonding a flexible substrate to the semiconductor device layer; and
   separating the mother substrate and the releasing layer pattern at an interface therebetween to remove the mother substrate.

2. The method of claim 1, wherein the releasing layer is formed of one of MgO, MnO, Mn3O4, MoOy, SnO2, SeOx, SiOx, GaOx, InO, TixOy, VxOy, ZrOy, WOy, Al2O3, SrO, TexOy, TeO2, ZnO, ITO, IZO, SiN, TiN, TaN, AN, BN, MO2N, VN, ZrN, NbN, CrN, Ga and combinations thereof.

3. The method of claim 1, wherein the releasing layer is formed to have a thickness of approximately 1 nm or more.

4. The method of claim 1, wherein the metal layer is formed of one of Ag, Au, Cu, Cr, W, Al, Mo, Zn, Ni, Pt, Pd, Co, In, Mn, Si, Ta, Ti, Sn, Zn, Pb, V, Ru, Ir, Zr, Rh and combinations thereof.

5. The method of claim 4, wherein the metal layer is formed to have a thickness of approximately 1 nm or more.

6. The method of claim 1, wherein the insulating layer is formed of an insulator comprising one of silicon oxide (SiO2), silicon nitride (SiNx), photoresist, polyimide and combinations thereof.

7. The method of claim 1, wherein the semiconductor device layer comprises at least one of an organic light emitting diode and an organic field effect transistor.

8. The method of claim 1, wherein a glass substrate is used as the mother substrate.

9. The method of claim 1, wherein a plastic substrate is used as the flexible substrate.

10. A method of manufacturing a flexible display where a light emitting device of a semiconductor device layer functions as a unit pixel, the method comprising:
    forming a releasing layer on a mother substrate;
    forming a releasing layer pattern by patterning the releasing layer;
    forming a metal layer on the releasing layer pattern;
    forming an insulating layer on the metal layer;

forming a semiconductor device layer comprising a light emitting device on the insulating layer;

bonding a flexible substrate to the semiconductor device layer; and separating the mother substrate and the releasing layer pattern at an interface therebetween to remove the mother substrate.

11. The method of claim 10, wherein the releasing layer is formed of one of MgO, MnO, Mn3O4, MoOy, SnO2, SeOx, SiOx, GaOx, InO, TixOy, VxOy, ZrOy, WOy, Al2O3, SrO, TexOy, TeO2, ZnO, ITO, IZO, SiN, TiN, TaN, AN, BN, MO2N, VN, ZrN, NbN, CrN, Ga and combinations thereof.

12. The method of claim 10, wherein the metal layer is formed of one of Ag, Au, Cu, Cr, W, Al, Mo, Zn, Ni, Pt, Pd, Co, In, Mn, Si, Ta, Ti, Sn, Zn, Pb, V, Ru, Ir, Zr, Rh and combinations thereof.

13. The method of claim 10, wherein the insulating layer is formed of an insulator comprising one of silicon oxide (SiO2), silicon nitride (SiNx), photoresist, polyimide and combinations thereof.

14. The method of claim 10, wherein the semiconductor device layer comprises at least one of an organic light emitting diode and an organic field transistor.

15. The method of claim 10, wherein a glass substrate is used as the mother substrate.

16. The method of claim 10, wherein a plastic substrate is used as the flexible substrate.

* * * * *